United States Patent
Wong

(10) Patent No.: US 11,734,105 B2
(45) Date of Patent: *Aug. 22, 2023

(54) EFFICIENT ERROR REPORTING IN A LINK INTERFACE

(71) Applicant: INTERNATIONAL BUSINESS MACHINES CORPORATION, Armonk, NY (US)

(72) Inventor: Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 355 days.

This patent is subject to a terminal disclaimer.

(21) Appl. No.: 16/921,316

(22) Filed: Jul. 6, 2020

(65) Prior Publication Data

US 2022/0004453 A1 Jan. 6, 2022

(51) Int. Cl.
| | |
|---|---|
| G06F 11/00 | (2006.01) |
| G06F 11/10 | (2006.01) |
| H04L 67/06 | (2022.01) |
| H03L 7/081 | (2006.01) |
| G06F 9/448 | (2018.01) |
| G06F 11/30 | (2006.01) |

(52) U.S. Cl.
CPC ........ *G06F 11/1004* (2013.01); *G06F 9/4498* (2018.02); *G06F 11/302* (2013.01); *H03L 7/0814* (2013.01); *H04L 67/06* (2013.01)

(58) Field of Classification Search
CPC .. G06F 11/1004; G06F 9/4498; G06F 11/302; G06F 11/3041; G06F 11/3065; G06F 11/0766; H03L 7/0814; H04L 67/06

USPC .......................... 714/758, 799, 807
See application file for complete search history.

(56) References Cited

U.S. PATENT DOCUMENTS

| | | | |
|---|---|---|---|
| 5,233,348 A | 8/1993 | Pollmann et al. | |
| 5,343,195 A | 8/1994 | Cooper | |
| 5,666,116 A | 9/1997 | Bakhmutsky | |
| 6,496,540 B1 | 12/2002 | Widmer | |
| 7,010,607 B1 | 3/2006 | Bunton | |
| 7,152,128 B2 * | 12/2006 | Wehage | G06F 13/42 710/305 |

(Continued)

OTHER PUBLICATIONS

OpenCAPI Consortium, "OpenCAPI3.0 Data Link Layer Specification", AdvanceVersion1.2, Mar. 21, 2017, 32 pages. <br>.*

(Continued)

*Primary Examiner* — Albert Decady
*Assistant Examiner* — Osman M Alshack
(74) *Attorney, Agent, or Firm* — Teddi E. Maranzano

(57) ABSTRACT

A link interface is provided of a communication protocol using idle flow control digits (flits) to maintain link continuity. The link interface includes: a physical layer of the communication protocol configured to transmit and receive flits via a link, wherein the communication protocol provides for idle flits of first and second sizes for maintaining link continuity, the first size being smaller than the second size; and a data link layer configured to transmit and receive flits to/from the physical layer. The data link layer is configured to remove idle flits of the first size received from the physical layer and to report cyclic redundancy check errors of filtered first sized idle flits in a correct order in relation to other flits.

15 Claims, 8 Drawing Sheets

(56) References Cited

U.S. PATENT DOCUMENTS

| | | | |
|---|---|---|---|
| 9,306,863 | B2 | 4/2016 | Birrittella |
| 9,836,424 | B2* | 12/2017 | Ajanovic ............ G06F 13/4273 |
| 9,910,809 | B2 | 3/2018 | Halleck et al. |
| 10,152,446 | B2 | 12/2018 | Iyer et al. |
| 2003/0093632 | A1 | 5/2003 | Osborne |
| 2006/0101178 | A1* | 5/2006 | Zhong ................ G06F 13/3625 710/112 |
| 2014/0115420 | A1* | 4/2014 | Willey ................ G06F 13/4282 714/758 |
| 2015/0003247 | A1* | 1/2015 | Mejia ...................... H04L 45/18 370/235 |
| 2015/0180782 | A1 | 6/2015 | Rimmer et al. |
| 2017/0177527 | A1* | 6/2017 | Lovett ................... G06F 13/364 |
| 2018/0196710 | A1* | 7/2018 | Iyer ....................... H04L 1/0045 |
| 2018/0241507 | A1 | 8/2018 | Kohda et al. |
| 2019/0042380 | A1* | 2/2019 | Das Sharma ........ G06F 13/4295 |
| 2019/0095363 | A1* | 3/2019 | Agarwal ............. G06F 13/1668 |
| 2019/0281025 | A1* | 9/2019 | Harriman ............... H04L 9/3239 |
| 2021/0103545 | A1* | 4/2021 | Wong ...................... G06F 13/38 |

OTHER PUBLICATIONS

Stuecheli et al., "IBM POWER9 opens up a new era of acceleration enablement: OpenCAPI", IBM J. Res. & Dev., vol. 62, No. 4/5, Paper 8, Jul./Sep. 2018, pp. 8:1-8:8.

Pending U.S. Appl. No. 16/591,035, filed Oct. 2, 2019, entitled: "Link Interface", 34 pages.

Grace Period Disclosure: Flash Memory Summit, Aug. 5-8, 2019, Santa Clara, CA, Deickmann, "Keynote 7: Microchip, Subject: Enabling Innovation Through Flexible Infrastructure", Aug. 7, 2019, Abstract pp. 25-27, https://www.flashmemorysummit.com/English/Conference/Keynotes_2019.html.

Microchip, "Serial Memory Technology White Paper", May 14, 2019, DS00003192B—p. 1—DS00003192B—p. 8, https://www.microsemi.com/product-directory/memory-solutions/5551-smart-memory-controller-1000.

OpenCAPI Consortium, "OpenCAPI 3.0 Data Link Layer Specification", Advance Version 1.2, Mar. 21, 2017, 32 pages.

IBM: List of IBM Patents or Patent Applications Treated as Related (Appendix P), Jul. 6, 2020, pp. 1-2.

* cited by examiner

EFFICIENT ERROR REPORTING IN A LINK INTERFACE

STATEMENT REGARDING PRIOR DISCLOSURES BY THE INVENTOR OR A JOINT INVENTOR

Aspects of the present invention have been disclosed by the Applicant, who obtained the subject matter disclosed directly from the inventors, in a Field Programmable Gate Array (FPGA) used on the Apollo test board for the Open-CAPI memory buffer application-specific integrated circuit (referred to as the SMC1000 serial memory controller), demonstrated to the public at the Flash Memory Symposium held on Aug. 5, 2019. Applicant notes that aspects of the present invention relate to the FPGA and do not relate to any inner workings of the SMC1000.

BACKGROUND

The present invention relates to link interfaces that are configured to transmit and receive Flow Control Digits (flits) via a link, and more specifically, to efficient error reporting in such link interfaces.

Link interfaces support data transfer between a host processor and a device as a high-speed processor expansion bus. Such interfaces may adhere to a communication protocol which provides a standard for data transfer and may support control and response packets to be passed between the host processor and a device. An example of such a communication protocol is Open Coherent Accelerator Processor Interface (OpenCAPI). OpenCAPI is a data transfer standard that allows control and response packets to be passed between a host processor and an OpenCAPI device.

FIG. 1 shows the standard upstream and downstream data flow 100 between a host processor 110 and a device 120, known as the OpenCAPI Stack. From FIG. 1 it can be seen that an OpenCAPI interface in a host processor 110 is divided into three parts: Transaction Layer (TL) 111, Data Link Layer (DL) 112 and the Physical Layer (PHY) 113. Similarly, an OpenCAPI interface of an OpenCAPI device 120 is sub-divided in the same manner, with a Physical Layer (PHYX) 123, Transaction Layer (TLX) 121 and Data Link Layer (DLX) 122.

The host processor forms control packets in the TL and forwards these to the DL. The DL is further sub-divided into a Transmit (Tx) and Receive (Rx) side. The Tx side of the DL adds what is termed "DL Content" to the incoming TL control packet to form a Flow Control Digit (flit). This flit is then serialized by the PHY layer and sent to the device.

At the device end, an incoming serial stream is formatted back into flits by the PHYX layer. The Rx side of the DLX layer then takes these flits, checks for correct Cyclic Redundancy Check (CRC) and examines the DL Content to determine whether it needs to be forwarded to the TLX layer. If this is so, the TLX layer decodes the control packet and, based on its content, instructs an AFU (Attached Functional Unit) of the device, which contains the bulk of the device's functionality, to carry out the host's instruction.

Once the command is carried out, the device issues a response packet which is formatted by the TLX layer and then the DLX layer into another flit (in a similar way that the TL and DL did this for the host in the downstream direction). The packet is then serialized via PHYX and sent, upstream, to the host processor 110.

For typical link interfaces (including those employing OpenCAPI), once a link between host and device is up and running, flits must be sent continuously in both directions in order to maintain link continuity. For this reason, such link interfaces provide for idle flits (or null flits) to be transmitted. Any idle flits are not forwarded to the TLX level. Because idle flits may be of differing sizes, they may not necessarily appear conveniently aligned on a Flit_In bus. For example, part of an idle flit may appear in a portion of the Flit_In bus on one cycle and the remainder of the idle flit will then appear at the next cycle. Conventional link interfaces only cater for receiving idle flits of a single, fixed size.

BRIEF SUMMARY

According to an aspect of the present invention there is provided a link interface of a communication protocol using idle flow control digits (flits) to maintain link continuity, the link interface comprising: a physical layer of the communication protocol configured to transmit and receive flits via a link, wherein the communication protocol provides for idle flits of first and second sizes for maintaining link continuity, the first size being smaller than the second size; and a data link layer configured to transmit and receive flits to/from the physical layer; wherein the data link layer is configured to remove idle flits of the first size received from the physical layer and to report cyclic redundancy check errors of filtered first sized idle flits in a correct order in relation to other flits.

In one embodiment, there are four lanes 0-3 in a flit input bus and a delay logic: determines if there is a part of a second size flit on lane 0 and if any of lanes 1, 2 or 3 simultaneously hold a first size idle flit which has a CRC error; and if so, delays reporting of the error by one cycle until after the second size flit has been output.

According to another aspect of the present invention there is provided a computer-implemented method for a link interface of a communication protocol using idle flow control digits (flits) to maintain link continuity, the method comprising: at a physical layer of the link interface, transmitting and receiving flits via a link, the physical layer being of the communication protocol, wherein the communication protocol provides for idle flits of first and second sizes for maintaining link continuity, the first size being smaller than the second size; at a data link layer of the link interface, transmitting and receiving flits to/from the physical layer, including: removing idle flits of the first size received from the physical layer; and reporting cyclic redundancy check errors of filtered first sized idle flits in a correct order in relation to other flits.

According to a further aspect of the present invention there is provided a computer-implemented method carried out at a data link layer of a link interface of a communication protocol using idle flow control digits (flits) to maintain link continuity, the method comprising: transmitting and receiving flits to/from a physical layer or idle flits of first and second sizes for maintaining link continuity, the first size being smaller than the second size, including: removing idle flits of the first size received from the physical layer; and reporting cyclic redundancy check errors of filtered first sized idle flits in a correct order in relation to other flits.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

Preferred embodiments of the present invention will now be described, by way of example only, with reference to the following drawings.

FIG. 6 is schematic diagram showing a truth table of the Finite State Machine of FIG. 4, in accordance with an embodiment of the invention;

Figure 1:
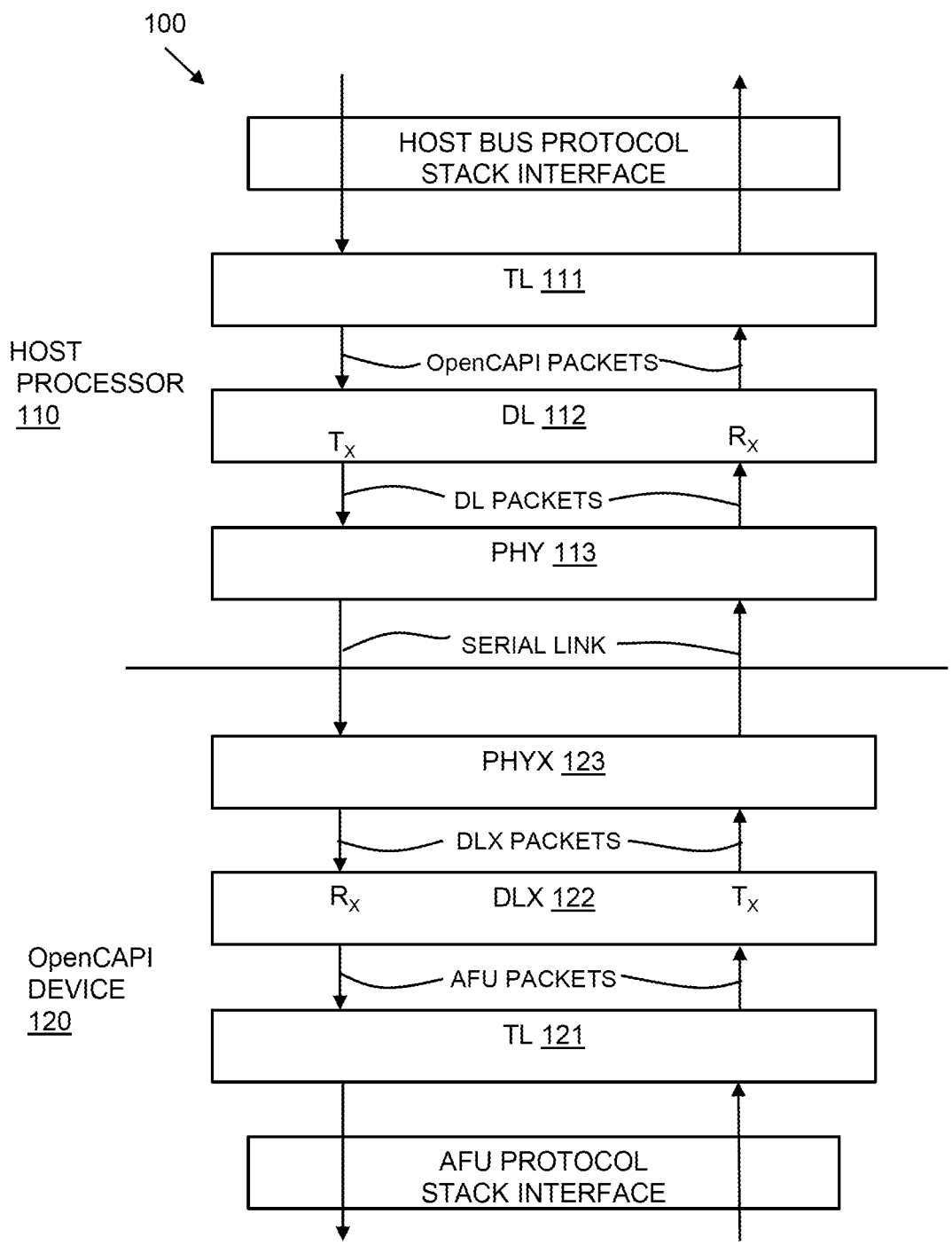
FIG. 1 illustrates the standard upstream and downstream data flow between a host and device implementing the OpenCAPI protocol, in accordance with an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Link interfaces are known that use a communication protocol configured to transmit and receive flow control digits (flits) and that use idle flow control digits (idle flits) to maintain link continuity. The described method and system provide efficient reporting of link interface short idle flit cyclic redundancy clock errors.

A link interface of a communication protocol, such as the OpenCAPI interface, transmits and receives flits with the link interface including a physical layer of the communication protocol configured to transmit and receive flits via a link and a data link layer configured to transmit and receive flits to/from the physical layer. The communication protocol provides for idle flits of first and second sizes for maintaining link continuity, with the first size being smaller than the second size, and the data link layer is configured to remove idle flits of the first size received from the physical layer. In this way a short idle flits filter is provided for removing idle flits of the first size at a data link (e.g. DL or DLX) level of a link interface, thereby only allowing control or data flits or idle flits of the second size to be passed onto the transaction layer (e.g. TL or TLX) of the link interface.

This short idle flit filter design is augmented with a described delay logic for reporting of CRC errors from short idle flits to ensure any control flits, data flits, or long idle flits which appear in the stream before those short idle flits are output first and acknowledged (ACK counts updated)

A finite state machine of the short idle flit filter is augmented with additional outputs to drive the delay logic so that short idle CRC errors are reported at the right times. The advantage of causing the CRC errors to be reported at the correct times is that potentially fewer transaction layer control and data flits must be re-sent during a replay thus improving performance The described method and system ensure that CRC errors from short idle flits in an OpenCAPI link are reported in an efficient order. Data layer links have the option of either using 64 byte long idles or more bandwidth efficient 16 byte short idles to space out OpenCAPI traffic. The filtering out of short idle flits incoming on the receiver of an OpenCAPI data link layer that are intermingled with a serial bit stream of long flits is carried out by the incoming serial stream being de-serialized and placed onto a 64 byte wide bus. When short idles are being utilized, the bus is connected to the input of the filter which will filter out 16 byte short idle flits to produce a 64 byte wide bus at its output only containing 64 byte long flits.

Embodiments of the short idle flit filter may enable the data link (DL or DLX) layer to cope with any combination of idle flits of two differing lengths (e.g. short and long idle flit) coming in from the other end of a link. Unlike, conventional link interface designs (which can only cope with idle flits of standard length), embodiments may provide compliance and full flexibility with respect to various communication protocols (such as the OpenCAPI specification) with regard to handling idle flits.

In some embodiments of the filter, the data link layer comprises a flit filter component configured to determine if a current flit received from the physical layer for a current processing cycle is an idle flit of the first size based on a previous flit received from the physical layer for a previous cycle. By way of example, the flit filter component may comprise a finite state machine configured to change states based on a type of the current flit and a type of the previous flit. The flit filter component may also comprise a barrel shifter comprising a plurality of registers of the first size. The finite state machine may then be configured to control the barrel shifter based on its state.

By way of example, an idle flit of first size may be n bits in length, and an idle flit of second size may be of m*n bits in length (wherein n and m are integers). In particular, in proposed embodiments, n may be equal to 128, and m may be equal to 4. Such embodiments may be configured for use with a 512-bit Flit_In bus that is designed to cater for 512 bit (64 byte) control flits, data flits, and long idle flits. For example, wherein the communication protocol may comprise the OpenCAPI protocol. An idle flit of the first size may thus comprise a short idle flit, and an idle flit of the second size may thus comprise a long idle flit. Accordingly, proposed embodiments may provide compliance and full flexibility with the OpenCAPI specification with regard to handling idle flits.

As detailed above, embodiments of the filter propose the removal (i.e. filtering) of short idle flits on the receive side of the data link layer (DL or DLX) of a link interface. Such embodiments may be configured to monitor the types of flits: either short idle, long idle, control or data on an incoming Flit_In bus whenever PHYX layer asserts a Valid_In. By determining what flits are currently on the Flit_In bus and by referring to flits from Flit_In that were present on the previous cycle (that Valid_In=1), embodiments may filter out both short and long idle flits irrespective of which order the flits appear in.

As will be described in more detail below, determining what currently appears on the Flit_In bus may depend largely on what appeared on the bus during the previous cycle Valid_In=1. Proposed embodiments may be configured to 'remember' the previous state of Flit_In to help it determine the current state of Flit_In. For example, a Finite State Machine may be employed such that a current state of Flit_In is dependent on a previous state of Flit_In. This may enable the data link layer to cater for any combination of short and long idles arriving from the other end of the link.

By way of further explanation, embodiments of the filter are described with reference to a link interface employing the OpenCAPI protocol, wherein a data flit simply contains 512 bits of data that the TL or TLX layer wishes to transmit. A data flit does not contain a data link layer content section, whereas a control flit or idle flit does.

The short idle flit filter 310 comprises the following:
a barrel shifter 330 which is configured to filter out any short idle flits arriving on Flit_In and to collate the remaining Flit_In content (which will consist of partial control, idle or data flits) into complete 512-bit flits to output as Flit_Out 321;
four check blocks 340, one per lane, to verify the CRC of short idle flits; and
a Finite State Machine (FSM) 350 which is configured to control the Barrel Shifter 330 and the four CRC check blocks 340.

The barrel shifter 330 comprises three 128-bit holding registers, H1, H2 & H3 301 which store the contents of lanes 1, 2 & 3, respectively, whenever the signal holding_ctl is set. The signal holding_ctl is active whenever Valid_in=1 312 and the current Flit_In state is not SSSS.

The output of the barrel shifter 330 is a multiplexor 360 which is configured to multiplex onto Flit_Out portions of the Flit_In bus 311 and the holding registers, depending upon the state of a 4-bit control bus called bs_mux_ctl.

The output of the multiplexor 360 is given by the truth table, Table 1, below:

TABLE 1

| bs_mux_ctl | | Flit_Out | | | |
|---|---|---|---|---|---|
| Bit 1 | Bit 0 | Lane 3 | Lane 2 | Lane 1 | Lane 0 |
| 0 | 0 | Flit_in Lane 3 | Flit_in Lane 2 | Flit_in Lane 1 | Flit_in Lane 0 |
| 0 | 1 | Flit_in Lane 2 | Flit_in Lane 1 | Flit_in Lane 0 | H3 |
| 1 | 0 | Flit_in Lane 1 | Flit_in Lane 0 | H3 | H2 |
| 1 | 1 | Flit_in Lane 0 | H3 | H2 | H1 |

Figure 2:
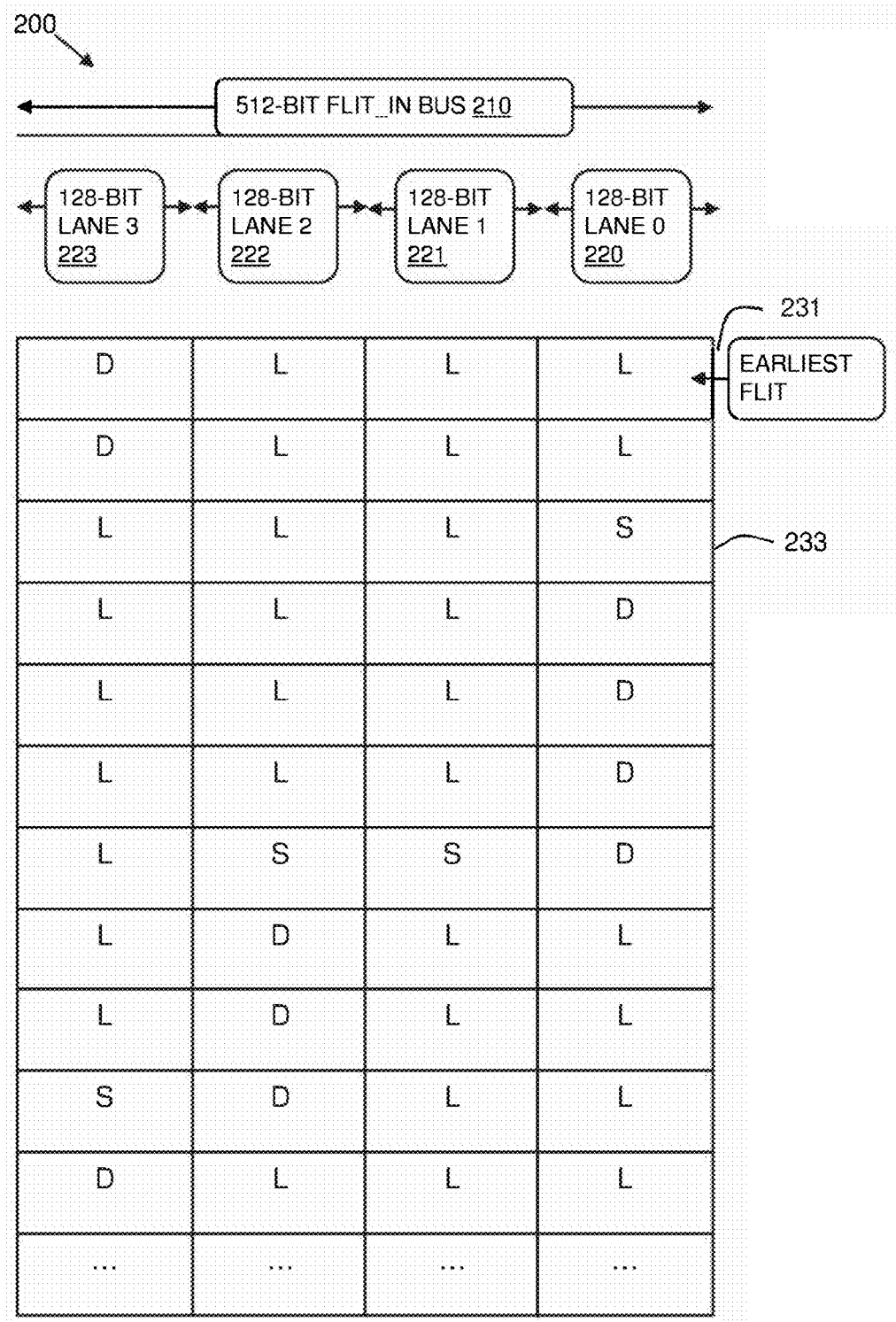
FIG. 2 depicts an exemplary sequence of flits received on a Flit_In bus, wherein the flits are represented using a 'D-L-S notation', in accordance with an embodiment of the invention.

FIG. 2 shows a schematic diagram 200 of a sequence of flits received on a Flit_In bus 210.

The 512-bit Flit_In and Flit_Out buses are both divided into four 128-bit lanes:

Bits 512:384=Lane 3 (223)

Bits 383:256=Lane 2 (222)

Bits 255:128=Lane 1 (221)

Bits 127:0=Lane 0 (220)

Within each lane there exists either a short flit or a 128-bit portion of a long flit. A 128-bit portion of a long flit will either contain data link layer content or not. In order to represent what is occupying a lane the following symbols are designated: 'S' indicates that a short idle flit occupies a lane, 'L' denotes a 128-bit portion of a long flit that does not contain data link layer content whilst 'D' indicates a 128-bit portion of a long flit that does contain data link layer content.

Since a control flit or a long idle flit are both 512-bit flits containing data link layer content, they are made up of one 'D' and three 'L' symbols and can be denoted as "DLLL". Since a data flit is a 512-bit flit that purely contains data (i.e. no DL content), it is made up of four 'L's and can thus be denoted as "LLLL".

The flits are represented using the above mentioned 'D-L-S notation'. Each row in FIG. 2 showing the locations of D-L-S on the Flit_In bus represents the state of Flit_In on each cycle. For instance, in FIG. 2, the first state 231 of the Flit_In bus is "DLLL" and the third state 233 is "LLLS".

Figure 3:
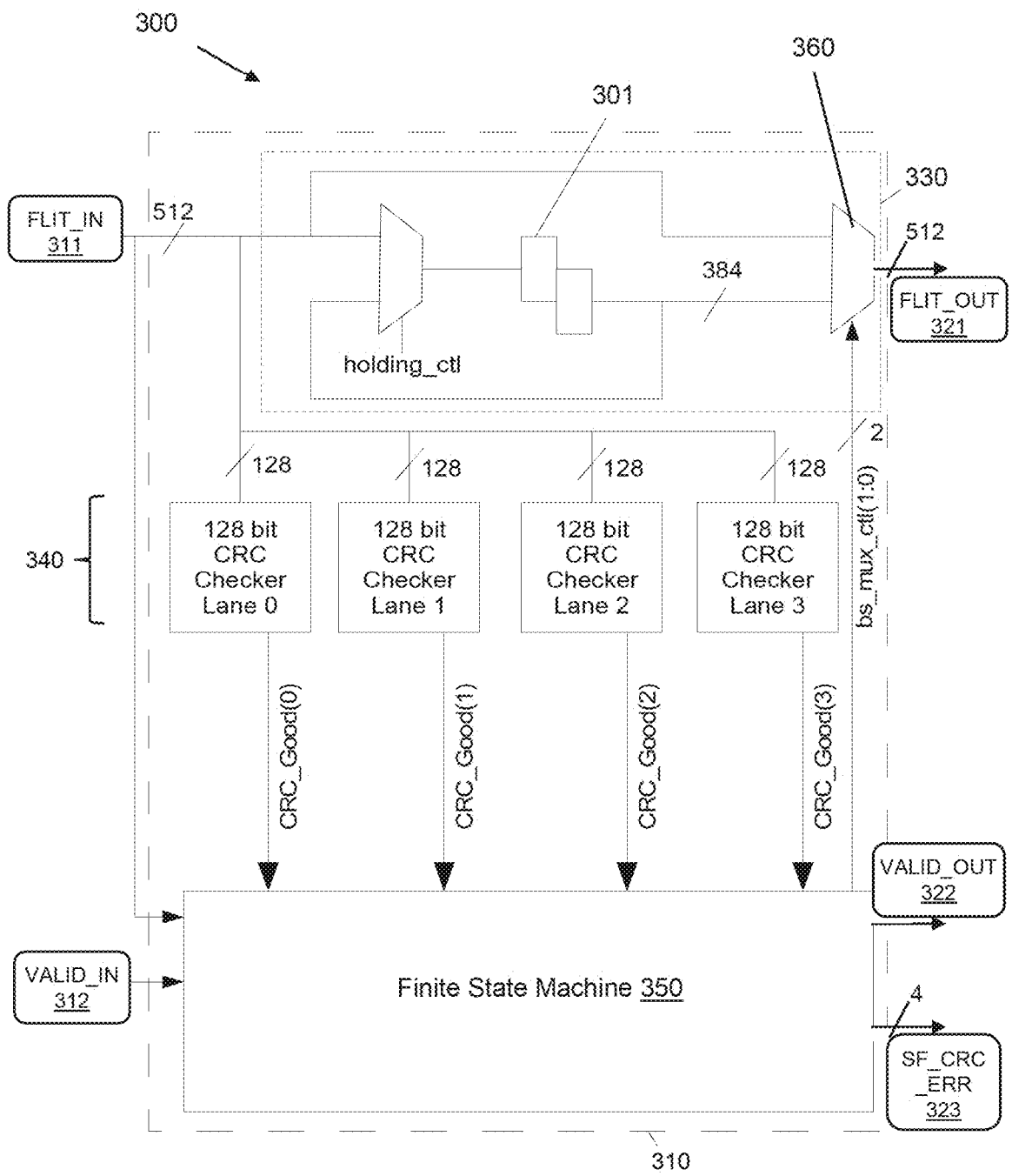
FIG. 3 is a schematic diagram of a Data Link layer of a link interface, in accordance with an embodiment of the invention.

Referring now to FIG. 3, a schematic diagram 300 shows a short idle flit filter 310 of a data link layer (DL or DLX) of a link interface. FIG. 3 thus depicts how the data link layer (DL or DLX) is configured so as to remove idle flits of a first size (e.g. short idle flits). The outputs of the short idle flit filter 310 may be filtered further on checking the CRC of long flits and filtering out long idle flits.

The bs_mux_ctl is controlled by the FSM 350 which uses this bus to filter out any short idles appearing on Flit_In 311. In order to do this, the FSM 350 determines the current state of Flit_In on each cycle and this may be based on what the state of Flit_In was on the previous cycle.

Whilst filtering out short idle flits, the processing checks the CRC of incoming short idle flits. The described short idle flit filters ensure that CRC errors are reported at the correct time with respect to the long flits it is passing through. The timing of when these short idle CRC errors are reported is important as it affects the point at which replays are started. If short idle CRC errors are reported too early then more of the OpenCAPI traffic must be replayed contributing to bandwidth loss.

The filter of FIG. 3 detects and reports short idle CRC errors as the short idles are detected at its input Flit_In bus. However, in some circumstances the reporting of these CRCs errors needs to be delayed by a cycle otherwise bandwidth is unnecessarily used up.

The FSM 350 takes as input the Flit_In 311, Valid_In 312, and CRC verifications from the check blocks 340, and outputs Valid_Out 322 and SF_CRC_ERR 323 as described further below.

Figure 4:
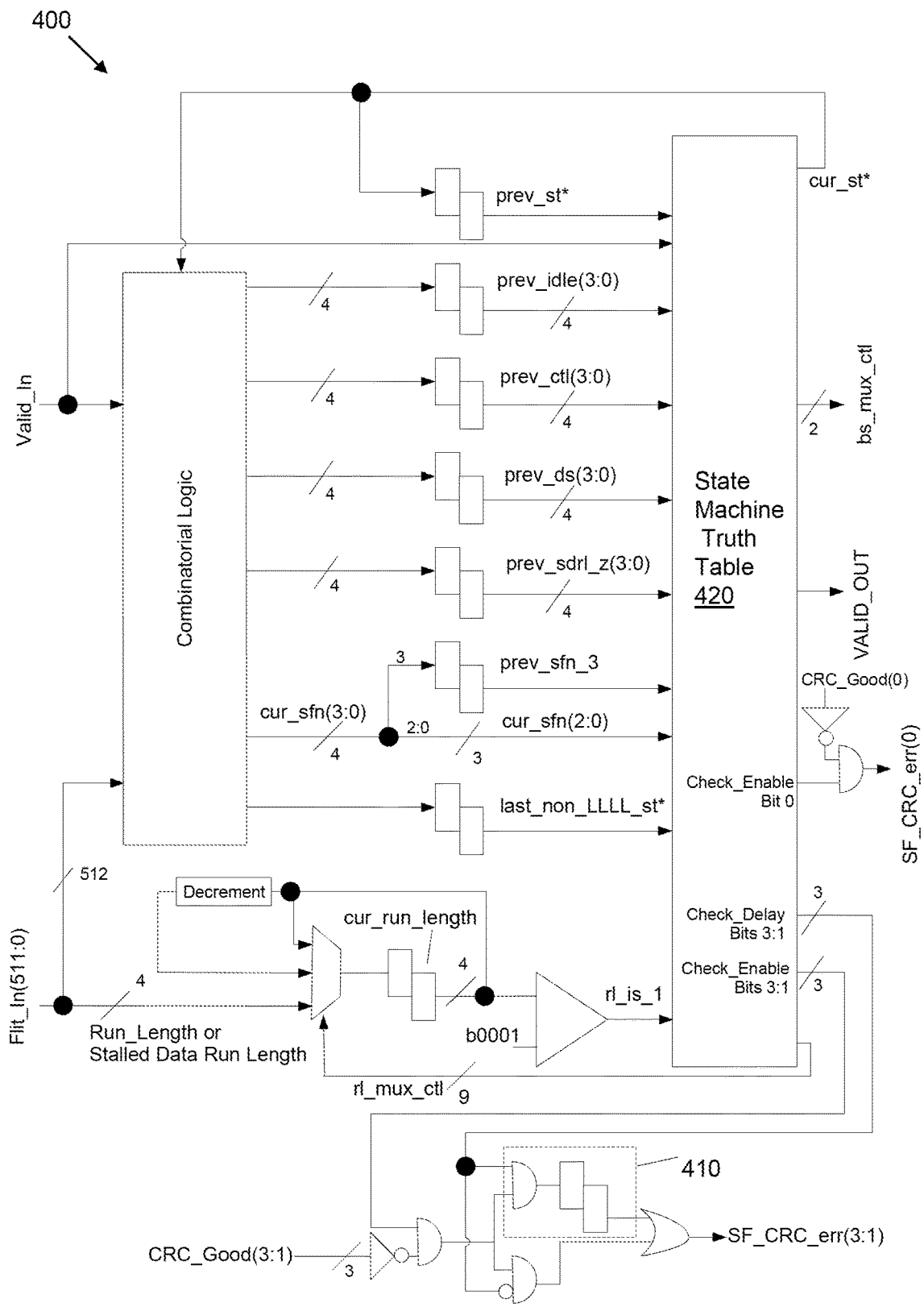
FIG. 4 is a schematic diagram of an example embodiment of the Finite State Machine of FIG. 3 including delay logic, in accordance with an embodiment of the invention.

By way of example, FIG. 4 depicts a schematic diagram 400 of the FSM 350 of FIG. 3 implemented as a Mealy State Machine. The state of Flit_In on the previous cycle is held in a register called prev_st and also reflects state of the FSM. One of the outputs of the FSM is the current state of Flit_In, namely cur_st, which is then latched as prev_st. cur_st is also fed back and combined in a combinatorial logic block with DL content from the lanes of Flit_In to form its inputs.

cur_st indicates which Flit_In lanes contain valid DL content (i.e. lanes with D's or S's). This DL content is then used to derive the inputs of the FSM as follows. It is noted that some of these inputs are derived from registers which reflect what was DL content stored from the previous cycle. The range of n in each case is 0<=n<=3:

Valid_In: This is the signal asserted by the PHYX layer to indicate that the contents of the Flit_In bus are valid;

prev_idle: This is a 4-bit register. prev_idle(n)=1 indicates that the DL content of lane n indicated that the run length on the previous cycle was xF and thus denoted an idle flit;

prev_ctl: This is a 4-bit register. prev_ctl(n)=1 indicates that the DL content of lane n on the previous cycle had a run length of zero which denoted a control flit with no data following it;

The FSM 350 of this example employs a register, called cur_run_length which is loaded with the run length indicated by the last control flit or the stalled data run length from the last idle flit. It decrements as each data flit is passed to TL(X) via a long idle Filter. When the cur_run_length register is 1 then rl_is_1=1.

The cur_run_length register is controlled from a 9-bit output bus, rl_ctl from the FSM. Each control bit in rl_mux_ctl is mutually exclusive and the effect of each control bit is defined in the truth table of Table 2 below.

TABLE 2

| rl_mux_ctl(8:0) | | | | | | | | | cur_run_length(t + 1) | Description |
|---|---|---|---|---|---|---|---|---|---|---|
| 0 | 0 | 0 | 0 | 0 | 0 | 0 | 0 | 0 | cur_run_length(t) | No Change |
| 1 | 0 | 0 | 0 | 0 | 0 | 0 | 0 | 0 | Flit_In(455:452) | Load cur_run_length register with Stalled Data Run Length from DL Content of Lane 3 |
| 0 | 1 | 0 | 0 | 0 | 0 | 0 | 0 | 0 | Flit_In(327:324) | Load cur_run_length register with Stalled Data Run Length from DL Content of Lane 2 |
| 0 | 0 | 1 | 0 | 0 | 0 | 0 | 0 | 0 | Flit_In(199:196) | Load cur_run_length register with Stalled Data Run Length from DL Content of Lane 1 |
| 0 | 0 | 0 | 1 | 0 | 0 | 0 | 0 | 0 | Flit_In(71:68) | Load cur_run_length register with Stalled Data Run Length from DL Content of Lane 0 |
| 0 | 0 | 0 | 0 | 1 | 0 | 0 | 0 | 0 | Flit_In(451:448) | Load cur_run_length register with Run Length from DL Content of Lane 3 |
| 0 | 0 | 0 | 0 | 0 | 1 | 0 | 0 | 0 | Flit_In(323:320) | Load cur_run_length register with Run Length from DL Content of Lane 2 |
| 0 | 0 | 0 | 0 | 0 | 0 | 1 | 0 | 0 | Flit_In(195:192) | Load cur_run_length register with Run Length from DL Content of Lane 1 |
| 0 | 0 | 0 | 0 | 0 | 0 | 0 | 1 | 0 | Flit_In(67:64) | Load cur_run_length register with Run Length from DL Content of Lane 0 |
| 0 | 0 | 0 | 0 | 0 | 0 | 0 | 0 | 1 | cur_run_length(t) − 1 | Decrement cur_run_length register | prev_ds: This is a 4-bit register. prev_ds(n)=1 indicates that lane n contained the DL content for a control flit on the previous cycle and that that DL content had its Data Stalled bit set;

prev_sdrl_z: This is a 4-bit register. prev_sdrl_z(n)=1 indicates that lane n contained the DL content for an idle flit on the previous cycle and that the Stalled Data Run Length field of that DL content was zero;

cur_sfn: This is a 4-bit bus. If cur_sfn(n)=1 this indicates that the DL content currently on lane n has the short flit next bit set and that that lane therefore currently contains a short idle. Note that only bits 0,1 & 2 are inputs to the FSM. Bit 3 is stored in a register to form prev_sfn_3 below;

prev_sfn_3: This is a 1-bit register which when set indicates that the DL content on lane 3 on the previous cycle had the short flit next bit set and that therefore lane 3 previously contained a short idle;

last_non_LLLL_st: This register records the last state of Flit_In (when Valid_In=1) which was NOT LLLL i.e. the last state to appear on Flit_In which had at least one lane with DL content;

rl_is_1: As mentioned above, when the run length is not xF, it indicates the number of data flits that immediately follow a control flit or idle flit.

Table 2 above shows what the value of the register will be on cycle t+1 depending on the rl_mux_ctl bit that is currently active on cycle t.

The short filter design is augmented with delay logic 410 of the reporting of CRC errors from short idle flits to ensure any control or data flits which appear in the stream before those short idles are output first and acknowledged (ACK counts updated). The state machine is also augmented with additional outputs to drive the delay logic 410 so that short idle CRC errors are reported at the right times.

The advantage of causing the CRC errors to be reported at the correct times is that potentially fewer transaction layer control and data flits must be re-sent during a replay.

In the embodiment of FIG. 4, VALID_OUT is generated directly from the state machine truth table 420. The Check_Delay outputs bits 3:1 are ANDed with the inverse of CRC_Good bits 3:1. The result of this AND or its one cycle delayed version (generated via a latch in the delay logic 410) is selected to represent whether any of lanes 3, 2, 1 had a short idle with a CRC error. The selection is made is made using the Check_Delay bits 3:1. Check_Delay(n) (where 1<=n<=3) indicates whether the reporting of a short idle CRC error should be delayed by one clock cycle so as to maintain correct ordering with respect to nearby long flits. A CRC error on lane 0 is reported immediately, i.e. no delay is necessary on this lane.

Figure 5:
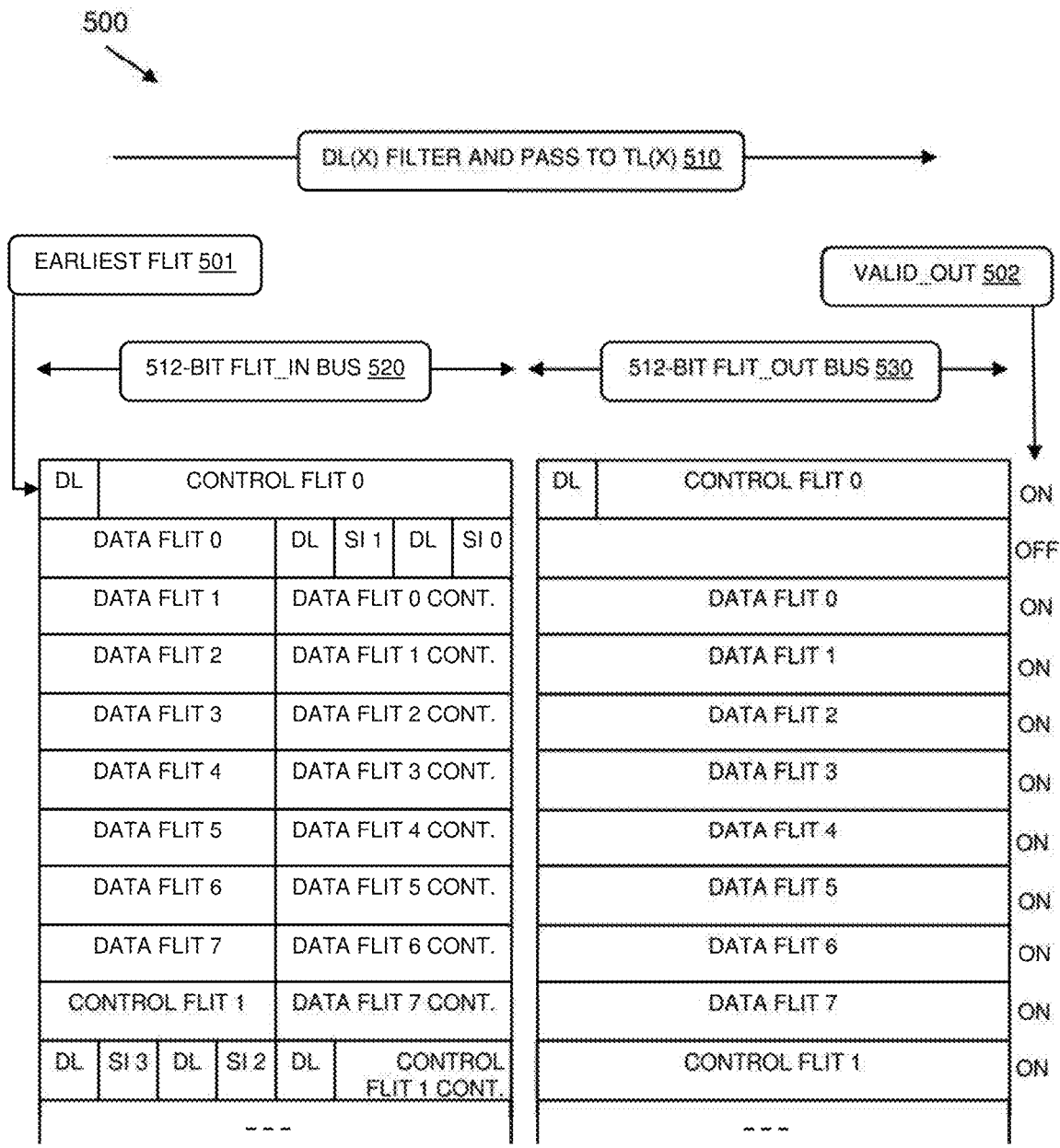
FIGS. 5A and 5B are schematic diagrams illustrating an example of a short idle filter flow, in accordance with an embodiment of the invention.

Referring to FIGS. 5A and 5B, a schematic diagram 500 shows a short idle filter flow 510 with an example input sequence the filter shown in FIG. 5A with the resulting output of the filter shown in FIG. 5B where the short idles have been filtered out.

FIG. 5A shows a 512-bit Flit_In bus 520 with an earliest flit 501 in the sequence. FIG. 5B shows a 512-bit Flit_Out bus 530 with a Valid_Out output 502.

If a CRC error were detected in either Short Idle Flits 0 or 1, then that error should be reported after Control Flit 0 but before the appearance of Control Flit 1 at the output since these short idles appear in the input stream between these control flits.

If a CRC error were detected in either Short Idle Flits 2 or 3, then that CRC error should be reported after Control Flit 1 emerges at the output. A conventional filter may report the CRC error at the same time or before the emergence of Control Flit 1 from the filter. If this were to occur, the DLX logic which keeps track of which flits have been received may not acknowledge it received Control Flit 1 before the CRC error occurred. Thus, when the replay of flits from the other end of the Data Layer link (with respect to the filter) after the CRC error occurs, it would have to include Control Flits 0 and 1 and the eight data flits in between. If the CRC error is reported at the correct time then it would be unnecessary to replay both control flits and the data flits. This would represent a saving in OpenCAPI link bandwidth and therefore a performance improvement.

This problem particularly applies to field-programmable gate array (FPGA) designs. In application-specific integrated circuits (ASICs), flits tend to be compressed onto much narrower bus widths, e.g. 16 bytes (as opposed to 64 bytes). This is because they are able to run at higher clock rates. This makes solution of the problem more straightforward in that only one flit will appear at the receiver input on any one cycle. The CRC can be checked for each flit in turn and short idle CRC errors can be reported in the correct order in time with respect to long flits. However, in FPGAs which require wider buses to compensate for slower clock rates this problem would occur.

Figure 6:
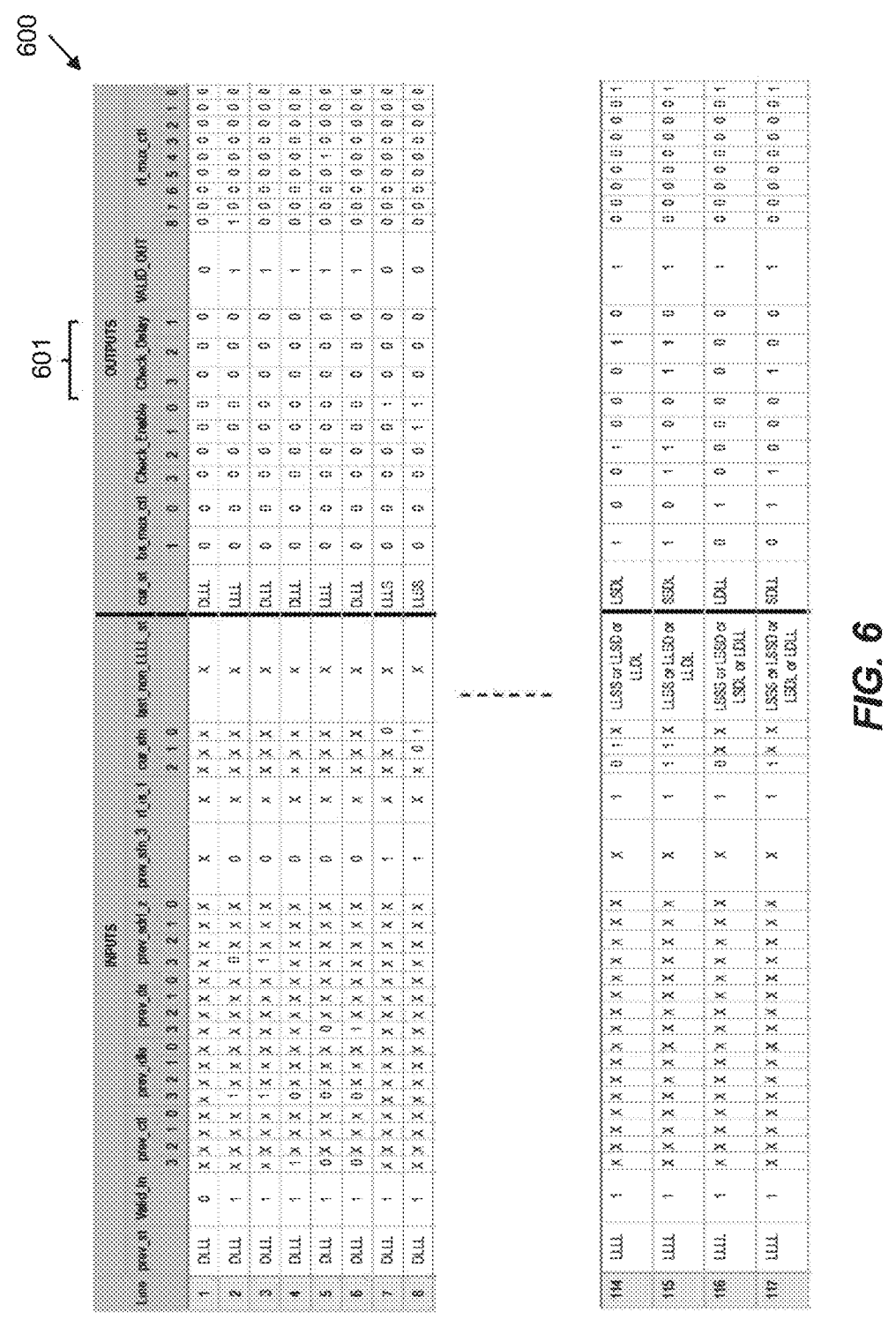

FIG. 6 shows the truth table 600 for the augmented state machine and details when the check delay outputs 601, Check_Delay(3:1) are driven. The state machine determines, on each clock cycle, what parts of a flit appears (either D, L or S) in each portion of the input bus, Flit_In. It deduces this from what flits appeared on Flit_In on the previous cycle along with the information in the DL contents of those flits. Using this information, the state machine is augmented to correctly determine the order that short idles and long flits appear in the input stream and therefore when short idle CRC errors should be reported.

FIG. 6 shows an exemplary truth table for the FSM 350 demonstrating an exemplary FSM operation, i.e. how the FSM 350 transitions from state to state according to the previous and current state of Flit_In and when the FSM outputs are driven.

Although each lane could be one of three states: D, L or S, and there are four lanes (thus making a theoretical total of 81 Flit_In states), most of these are not possible. For example, it is impossible for a short idle to appear immediately after a data flit so a combination such as SLLL is not a valid state. In fact, there are only 15 possible legal Flit_In states which is reflected in the 15 possible states of the FSM 350. Any signal or register that stores a state i.e. prev_st, cur_st or last_non_LLLL_st could therefore be encoded as a 4 bit value or as a 15 bit one-hot bus.

The CRC check blocks 340 each output a CRC_Good signal. Each of these is inverted and then ANDed to a Check_Enable signal produced by the FSM 350. The product of the AND between Check_Enable(0) and the inverse of CRC_Good(0) indicates whether the CRC of the short idle on lane 0 is good or not. This can be reported immediately in the form of the output signal from FSM 350 of SF_CRC_error(0) 323.

The products of the ANDs on lanes 1-3 between Check_Enable(n) and the inverse of CRC_Good(n) (where 1<=n<=3) each indicate whether the CRC of the short idle flit on those lanes is good or not. A CRC error on these lanes would be reported using the FSM 350 output signals SF_CRC_error(n). If there is a CRC error on any of these lanes it will either be reported in the current cycle that is detected or on the next cycle. If the error on a lane (1-3) is to be reported on the next cycle, FSM 350 asserts the signal Check_Delay(n) which causes the error to be stored on a latch in the delay logic 410. The output of this latch is then multiplexed on to the appropriate SF_CRC_Error(n) signal.

The delay is needed on a lane k (k=1,2 or 3) when the FSM asserts check_enable(k)=1 AND, on the same clock cycle, deems that no check is needed on lane 0 i.e. check_enable(0) is off.

According to an alternative embodiment, a processor may be used to analyze the state of the Flit_In bus. Once the link has been trained, the state of Flit_In may initialize to a known state according to the particular transfer protocol being used (in the OpenCAPI specification, this would be DLLL for example).

Since valid combinations of D, L & S must appear at the Flit_In bus on each transfer cycle, the processor may determine from the state of Flit_In during the previous cycle where the DL content of flits are in the state of Flit_In during the current cycle. Furthermore, examining this DL content in any one of the four lanes of Flit_In can then determine the state of the next adjacent lane, (e.g. seeing that the SFN bit in lane 3 is set means that a short idle (an S) must exist in lane 0 on the next transfer cycle). Using this information, the processor may take the contents of the lanes of Flit_In, remove the short and long idles to form the contents of Flit_Out in which no idles appear.

Figure 7:
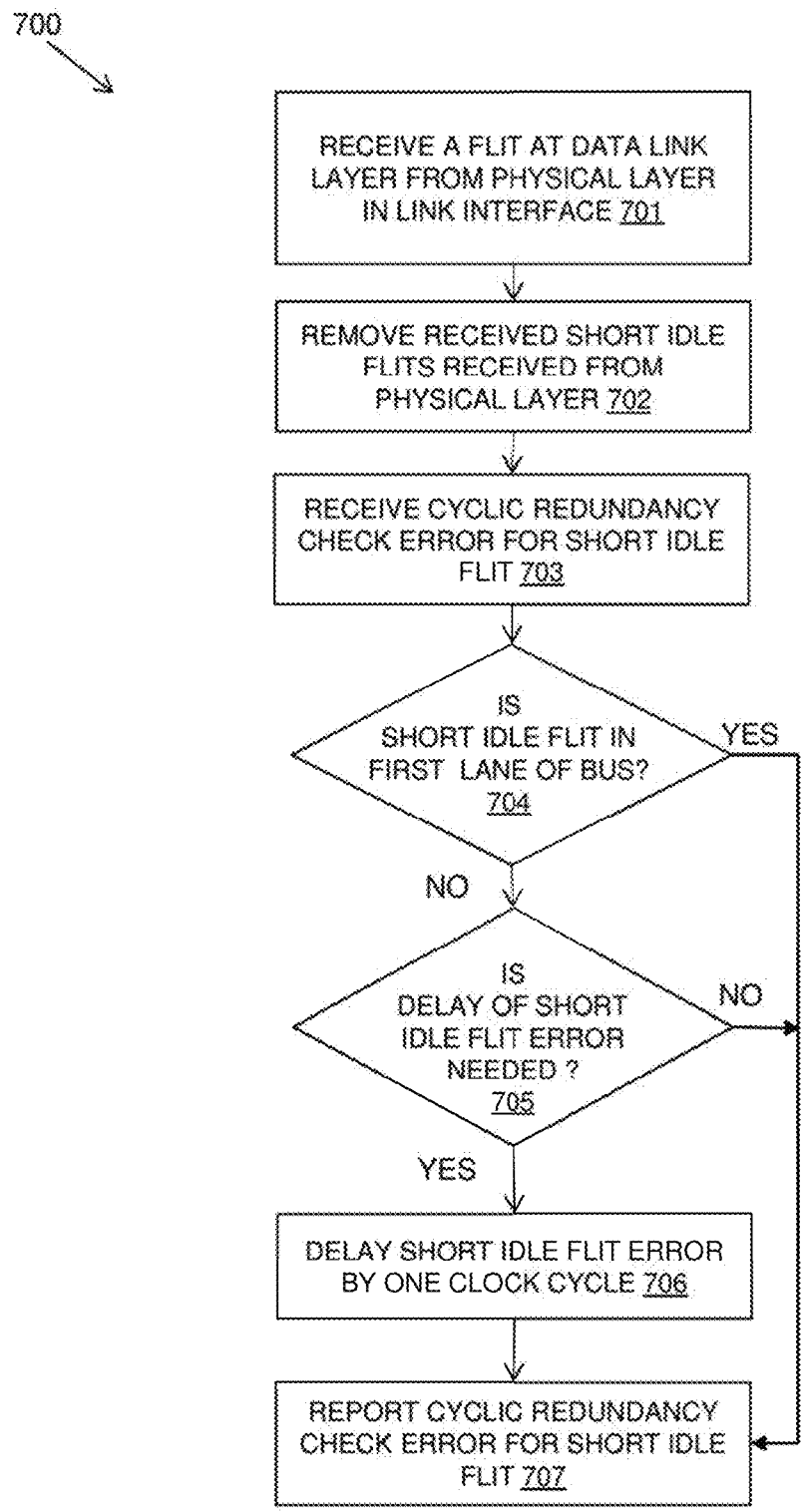
FIG. 7 is a flow diagram of an example embodiment of a method, in accordance with an embodiment of the invention.

Referring to FIG. 7, a flow diagram 700 shows an example embodiment of a method carried out by the at a data link layer (DL or DLX) of a link interface. The data link layer may receive 701 a flit from the physical layer (PHY or PHYX) and may remove 702 short idle flits to filter these.

The data link layer may receive 703 cyclic redundancy check errors for short idle flits and may determine 704 if they relate to a first lane (Lane 0) of the flit in bus, in which case they are reported 707. If they do not relate to the first lane, it may be determined 705 if a delay of the error report is needed in relation to other flits.

If there is a part of a long flit on lane 0 and any of lanes 1, 2 or 3 simultaneously hold a short idle flit which has a CRC error, then the reporting of that error needs to be delayed (by one cycle) until after that long flit has been output by the short idle filter.

If no delay is needed, the error is reported 707. If a delay is needed, the short idle flit error is delayed 706 by one clock cycle and then reported 707.

Figure 8:
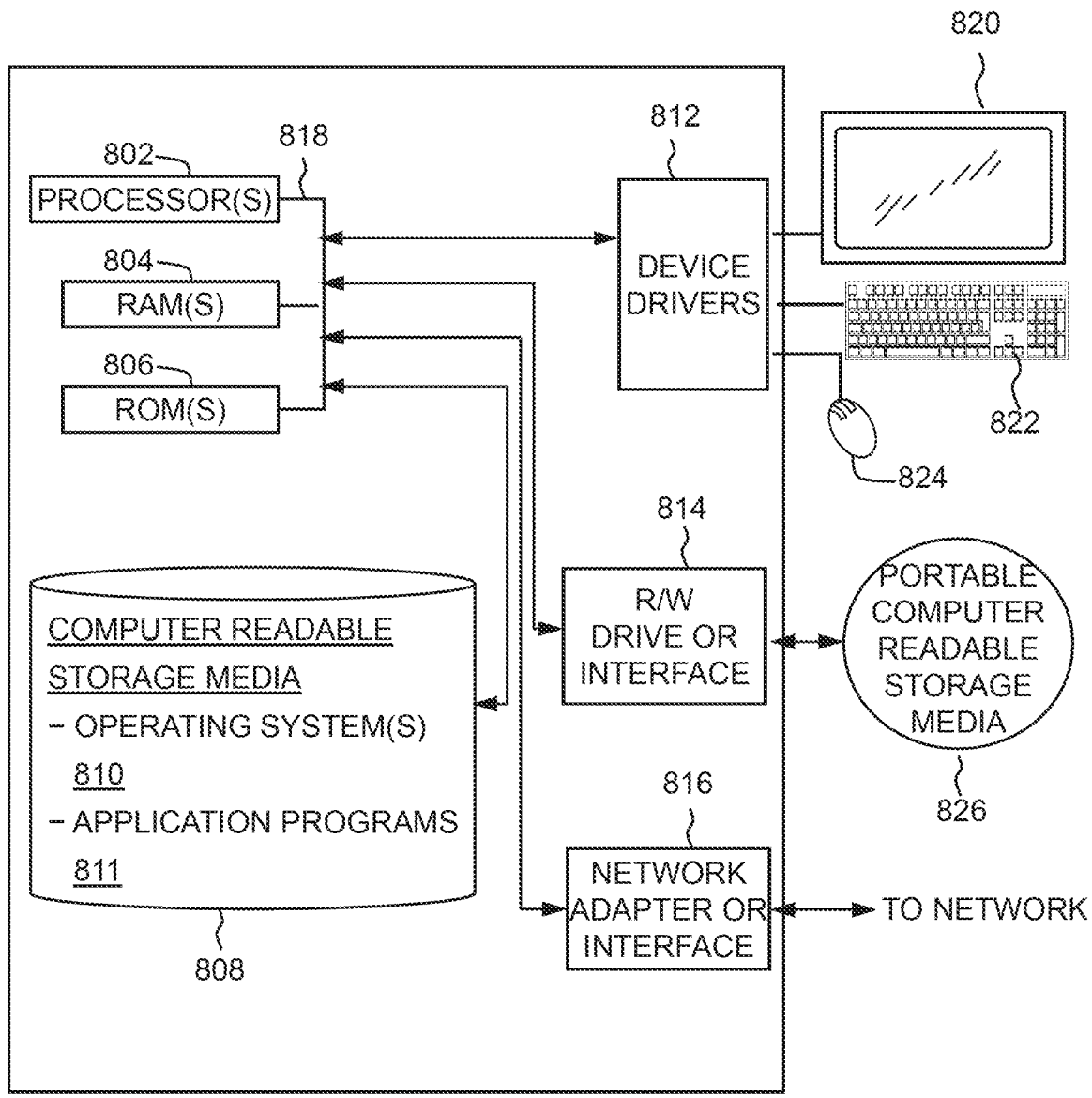
FIG. 8 is a block diagram of an embodiment of a computer system with which the present disclosure may be implemented, in accordance with an embodiment of the invention.

FIG. 8 800 depicts a block diagram of components of a computing system which may form part of a networked system. It should be appreciated that FIG. 8 provides only an illustration of one implementation and does not imply any limitations with regard to the environments in which different embodiments may be implemented. Many modifications to the depicted environment may be made.

The computing system can include one or more processor(s) 802, one or more computer-readable RAM(s) 804, one or more computer-readable ROM(s) 806, one or more computer readable storage media 808, device drivers 812, read/write drive or interface 814, and network adapter or interface 816, all interconnected over a communications fabric 818. Communications fabric 818 can be implemented with any architecture designed for passing data and/or control information between processors (such as microprocessors, communications and network processors, etc.), system memory, peripheral devices, and any other hardware components within the system.

One or more operating system(s) 810 and application programs 811 are stored on one or more of the computer readable storage media 808 for execution by one or more of the processor(s) 802 via one or more of the respective RAM(s) 804 (which typically include cache memory). In the illustrated embodiment, each of the computer readable storage media 808 can be a magnetic disk storage device of an internal hard drive, CD-ROM, DVD, memory stick, magnetic tape, magnetic disk, optical disk, a semiconductor storage device such as RAM, ROM, EPROM, flash memory, or any other computer readable storage media that can store a computer program and digital information, in accordance with embodiments of the invention.

The computing system can also include a R/W drive or interface 814 to read from and write to one or more portable computer readable storage media 826. Application programs 811 can be stored on one or more of the portable computer readable storage media 826, read via the respective R/W drive or interface 814 and loaded into the respective computer readable storage media 808.

The computing system can also include a network adapter or interface 816, such as a TCP/IP adapter card or wireless communication adapter. Application programs 811 can be downloaded to the computing device from an external computer or external storage device via a network (for example, the Internet, a local area network or other wide area networks or wireless networks) and network adapter or interface 816. From the network adapter or interface 816, the programs may be loaded into the computer readable storage media 808. The network may comprise copper wires, optical fibers, wireless transmission, routers, firewalls, switches, gateway computers and edge servers.

The computing system can also include a display screen 820, a keyboard or keypad 822, and a computer mouse or touchpad 824. Device drivers 812 interface to display screen 820 for imaging, to keyboard or keypad 822, to computer mouse or touchpad 824, and/or to display screen 820 for pressure sensing of alphanumeric character entry and user selections. The device drivers 812, R/W drive or interface 814, and network adapter or interface 816 can comprise hardware and software stored in computer readable storage media 808 and/or ROM 806.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A computer program product of the present invention comprises one or more computer readable hardware storage devices having computer readable program code stored therein, said program code executable by one or more processors to implement the methods of the present invention.

A computer system of the present invention comprises one or more processors, one or more memories, and one or more computer readable hardware storage devices, said one or more hardware storage device containing program code executable by the one or more processors via the one or more memories to implement the methods of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Improvements and modifications can be made to the foregoing without departing from the scope of the present invention.

What is claimed is:

1. A link interface of a communication protocol using idle flow control digits (flits) to maintain link continuity, the link interface comprising:
    a physical layer of the communication protocol configured to transmit and receive flits via a link, wherein the communication protocol transmits and receives flits via a link, wherein the idle flits are of first and second sizes for maintaining link continuity, the first size being short idle flits and the first size being smaller than the second size; and
    a data link layer configured to transmit and receive flits to/from the physical layer, wherein the data link layer includes a short flit filter component configured to determine if a current flit received from the physical layer for a current processing cycle is an idle flit of the first size, and wherein the short flit filter component includes delay logic for delaying a cyclic redundancy check error of a filtered first sized idle flit to a correct order in relation to other flits, and the delay logic ensures any second size flits in the form of control, data, or long idle flits which appear in an input stream before a short idle flit error are output and acknowledged before the short idle flit error; and
    wherein the data link layer is configured to remove idle flits of the first size received from the physical layer and to report the cyclic redundancy check errors of the filtered first sized idle flit in the correct order in relation to other flits.

2. The link interface of claim 1 wherein there are four lanes 0-3 in a flit input bus and wherein the delay logic determines if there is a part of a second size flit on lane 0 and if any of lanes 1, 2 or 3 simultaneously hold a first size idle flit which has a CRC error, and if so, the delay logic delays reporting of the CRC error by one cycle until after the second size flit has been output.

3. The link interface of claim 1, wherein the finite state machine takes in states of CRC verifications and outputs states of short idle flit CRC errors where no delay is needed, and wherein the finite state machine delays outputs to the delay logic where delay of short idle flit CRC errors are needed.

4. The link interface of claim 1, wherein there are four lanes in a flit input bus, and wherein the delay logic applies an AND operation to received finite state machine check delay bits 3:1 with an inverse of received CRC good bits 3:1, and wherein the result of this AND operation or its one cycle delayed version generated via a latch in the delay logic is selected to represent whether any of lanes 3, 2, 1 had a short idle with a CRC error, and wherein selection is made using check delay bits 3:1, with check_delay(n) (where $1<=n<=3$) indicating whether the reporting of a short idle CRC error should be delayed by one clock cycle so as to maintain correct ordering with respect to nearby long flits, and wherein a CRC error on lane 0 is reported with no delay.

5. The link interface of claim 1, wherein the communication protocol comprises the OpenCAPI protocol, and wherein an idle flit of the first size comprises a short idle flit, and wherein an idle flit of the second size comprises a long idle flit.

6. The link interface of claim 5, wherein a short idle flit is 128 bits in length and a long idle flit is 512 bits in length.

7. A computer-implemented method for a link interface of a communication protocol using idle flow control digits (flits) to maintain link continuity, the method comprising:
at a physical layer of the link interface, transmitting and receiving flits via a link, the physical layer being of the communication protocol, wherein the communication protocol provides for idle flits of first and second sizes for maintaining link continuity, the first size being short idle flits and the first size being smaller than the second size;
at a data link layer of the link interface, delaying a cyclic redundancy check error of a filtered first sized idle flit to a correct order in relation to other flits, thereby ensuring any second size flits in the form of control, data, or long idle flits which appear in an input stream before a short idle flit error are output and acknowledged before the short idle flit error; and
transmitting and receiving flits to/from the physical layer, including:
removing idle flits of the first size received from the physical layer; and
reporting the cyclic redundancy check error of the filtered first sized idle flits in a correct order in relation to other flits.

8. The method of claim 7, wherein delaying a cyclic redundancy check error ensures any second size flits in the form of control, data, or long idle flits which appear in an input stream before an error of a first size flit are output and acknowledged before the first size flit error.

9. The method of claim 7, wherein there are four lanes 0-3 in a flit input bus and wherein delaying a cyclic redundancy check error further comprises:
determining if there is a part of a second size flit on lane 0 and if any of lanes 1, 2 or 3 simultaneously hold first size idle flit which has a CRC error; and if so,
delaying reporting of the error by one cycle until after the second size flit has been output.

10. The method of claim 7, further comprising:
using the finite state machine to take in states of CRC verifications and output states of short idle flit CRC errors where no delay is needed and delay outputs to delay logic where delay of short idle flit CRC errors is needed.

11. The method of claim 7, wherein there are four lanes in a flit input bus and wherein delaying a cyclic redundancy check error further comprises:
applying an AND operation to received finite state machine check delay bits 3:1 with an inverse of received CRC good bits 3:1, wherein the result of this AND operation or its one cycle delayed version generated via a latch in delay logic is selected to represent whether any of lanes 3, 2, 1 had a short idle with a CRC error, and wherein selection is made using check delay bits 3:1, with check_delay(n) (where $1<=n<=3$) indicating whether the reporting of a short idle CRC error should be delayed by one clock cycle so as to maintain correct ordering with respect to nearby long flits, and wherein a CRC error on lane 0 is reported with no delay.

12. The method of claim 7, wherein the communication protocol comprises the OpenCAPI protocol, and wherein an idle flit of the first size comprises a short idle flit, and wherein an idle flit of the second size comprises a long idle flit.

13. The method of claim 12, wherein a short idle flit is 128 bits in length and a long idle flit is 512 bits in length.

14. A computer-implemented method carried out at a data link layer of a link interface of a communication protocol using idle flow control digits (flits) to maintain link continuity, the method comprising:
ensuring any second size flits in the form of control, data, or long idle flits which appear in an input stream before a short idle flit error are output and acknowledged before the short idle flit error;
transmitting and receiving flits to/from a physical layer or idle flits of first and second sizes for maintaining link continuity, the first size being short idle flits and the first size being smaller than the second size;
removing idle flits of the first size received from the physical layer; and
reporting cyclic redundancy check errors of filtered first sized idle flits in a correct order in relation to other flits.

15. The method of claim 14, wherein idle flits of the first size are short idle flits and delay logic ensures any second size flits in the form of control, data, or long idle flits which appear in an input stream before a short idle flit error are output and acknowledged before the short idle flit error.

\* \* \* \* \*